(12) United States Patent
Wei et al.

(10) Patent No.: US 6,847,238 B2
(45) Date of Patent: Jan. 25, 2005

(54) OUTPUT CIRCUIT AND METHOD FOR REDUCING SIMULTANEOUS SWITCHING OUTPUT SKEW

(75) Inventors: Yi-Kuang Wei, Taipei (TW); Chi Chang, Taipei (TW); Heng-Chen Ho, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/717,111

(22) Filed: Nov. 19, 2003

(65) Prior Publication Data

US 2004/0107060 A1 Jun. 3, 2004

(30) Foreign Application Priority Data

Dec. 3, 2002 (TW) ..................................... 091135067 A (51) Int. Cl.[7] ................................................ H03K 3/00
(52) U.S. Cl. ..................... 327/112; 327/161; 327/251; 326/85; 326/87
(58) Field of Search ............................... 327/9, 12, 112, 327/161, 231, 248, 249, 251, 253, 258, 379, 383; 326/21, 85, 87

(56) References Cited

U.S. PATENT DOCUMENTS 6,002,601 A * 12/1999 Pappalardo et al. .......... 363/71
6,046,624 A * 4/2000 Nam et al. ................... 327/530
6,166,562 A * 12/2000 Mita et al. ..................... 326/83
6,700,403 B1 * 3/2004 Dillon .......................... 326/37

* cited by examiner

Primary Examiner—Timothy P. Callahan
Assistant Examiner—An T. Luu
(74) Attorney, Agent, or Firm—Madson & Metcalf (57) ABSTRACT

An output circuit for outputting data with reduced simultaneous switching output skew includes N counts of output buffers and a comparator. The N counts of output buffers receive N counts of bit signals, respectively. At least one of the output buffers includes a delay unit for processing one of the bit signals into a delayed bit signal with an adjustable delay period in response to a delay signal, a pull-up unit electrically connected to the delay unit and a source voltage, and selectively enabled to output the delayed bit signal as a high level, and a pull-down unit electrically connected to the delay unit and a ground voltage, and selectively enabled to output the delayed bit signal as a low level. The comparator is electrically connected to the N counts of output buffers, compares the N counts of bit signals sampled at a first time spot and a second time spot, and generates the delay signal according to the comparing result.

21 Claims, 6 Drawing Sheets

OUTPUT CIRCUIT AND METHOD FOR REDUCING SIMULTANEOUS SWITCHING OUTPUT SKEW

FIELD OF THE INVENTION

The present invention relates to an output circuit, and more particularly to an output circuit for outputting data with reduced simultaneous switching output (SSO) skew. The present invention also relates to a method for reducing SSO skew.

BACKGROUND OF THE INVENTION

With increasing development of central processing units, the processing speeds thereof are progressively increased. For complying with the increasing processing speeds of the central processing units, the collocation of the chipset and the circuit layout of the external main board are sophisticated. Moreover, during transmission of data or commands, any tiny timing difference is critical.

Figure 1:
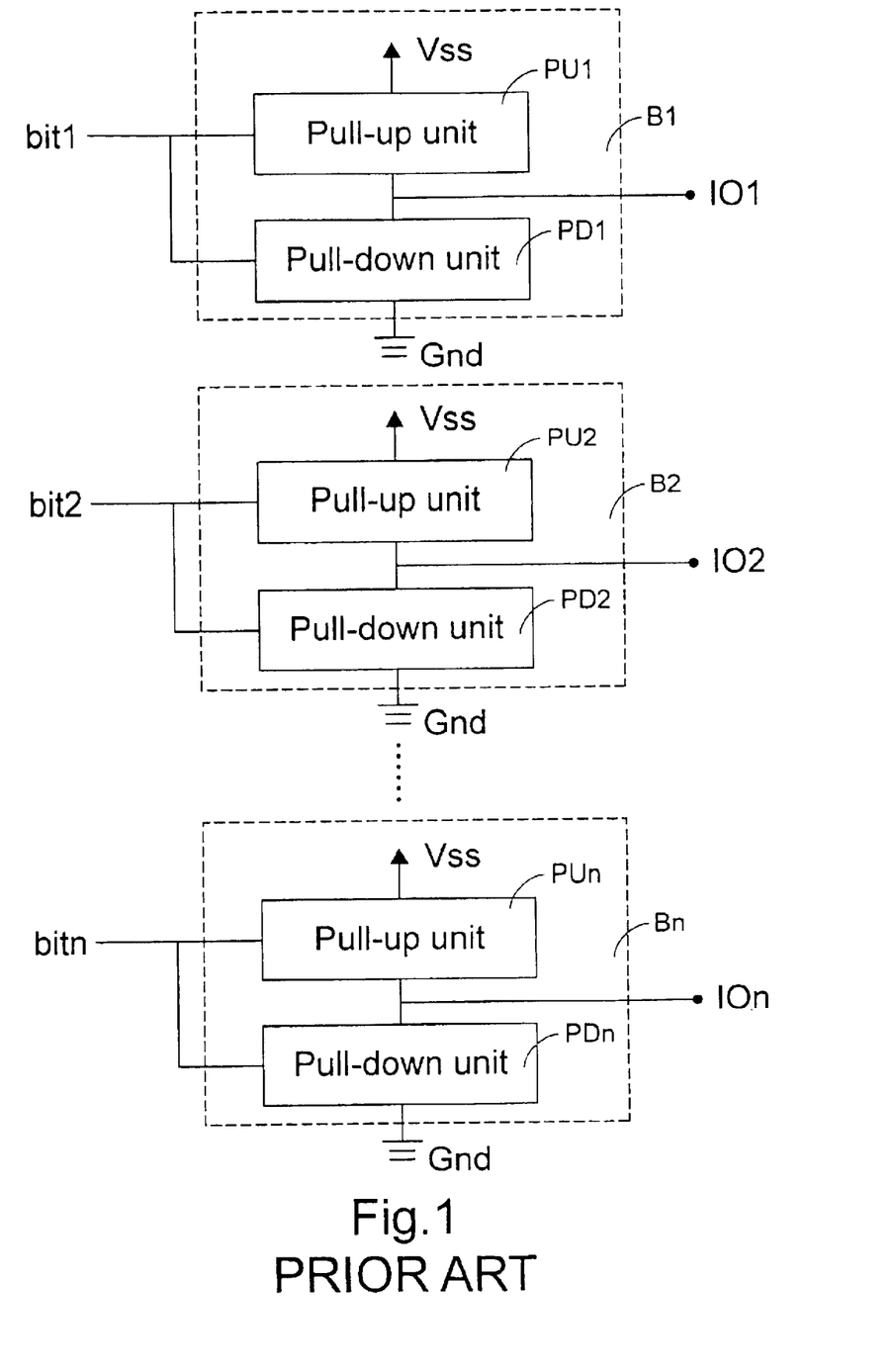
FIG. 1 is a circuit block diagram illustrating a conventional N-bit output circuit.

Please refer to FIG. 1, which schematically illustrates a conventional N-bit output circuit of an integrated circuit. Each of the output buffers B1~Bn comprises a pull-up unit (PU1~PUn) and a pull-down unit (PD1~PDn) coupled to a common power source Vss and a common ground Gnd, respectively. Each of the n-bit input signals bit1~bitn is inputted into corresponding one of the output buffers B1~Bn, respectively, and processed by the pull-up units PU1~PUn or the pull-down units PD1~PDn so as to output processed bit signals from output terminals IO1~IOn. The output terminals IO1~IOn are connection nodes of the pull-up units PU1~PUn and the pull-down units PD1~PDn. Take the output buffer B1 for example. When the first bit signal bit1 inputted into the output buffer B1 is at a high level, the pull-up unit PU1 is enabled, but the pull-down unit PD1 is disabled, thereby outputting a high-level output signal via the output terminal IO1. Whereas, when the first bit signal bit1 is at a low level, the pull-up unit PU1 is disabled, but the pull-down unit PD1 is enabled. Accordingly, it is a low-level output signal outputted via the output terminal IO1. The operation principles of other output buffers are analogous to that of the output buffer B1, which do not intend to be described redundantly herein.

Since all of the output buffers B1~Bn are electrically connected to the common power source Vss and the common ground Gnd, a so-called SSO skew phenomenon is suffered from. Generally, when the state of the output terminal of an output buffer is switching, power/ground bounce noise is derived from the flow of intense current through an equivalent parasitic inductance associated with bonding wires, lead frames and pins.

When the output terminals of a number of output buffers simultaneously change their output states from a low level to a high level or from a high level to a low level, the SSO skew phenomenon is likely to occur. Further, when the count of the output terminals on changing from the high level to the low level is much higher or lower than the count of the output terminals on changing from the low level to the high level at the same time, the SSO skew becomes more serious.

Figure 2A:
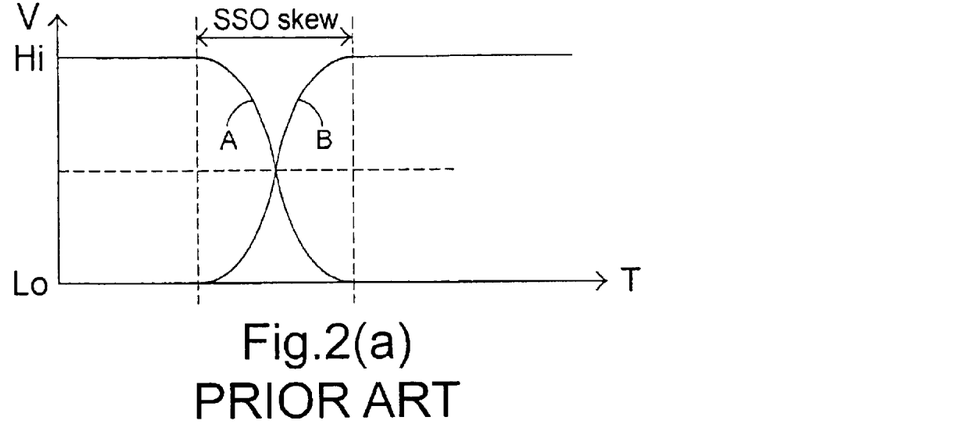
FIGS. 2(a), 2(b) and 2(c) are timing waveform diagrams showing degrees of SSO skew varying with number and status of output buffers on changing.

As shown in FIG. 2(a), when the number of output buffers changing from the high level to the low level and the number of output buffers changing from the low level to the high level at the same time are equal to each other, the SSO skew is minimal. It is because the period when the output terminals change from the high level to the low level (curve A) and the period when the output terminals change from the low level to the high level (curve B) are substantially coincident.

Figure 2B:
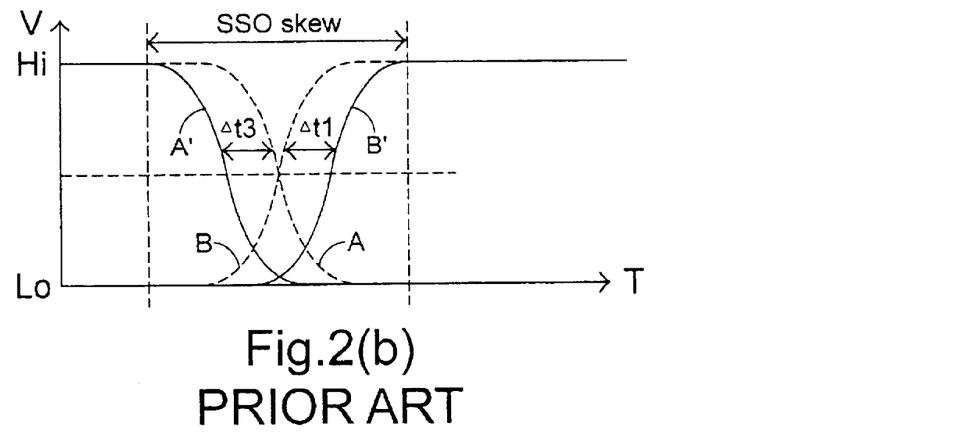

Referring to FIG. 2(b), a case that the number of output terminals changing from the high level to the low level is less than the number of output terminals changing from the low level to the high level is illustrated. Since the number of the output terminals on changing from the low level to the high level is increased compared to the case shown in FIG. 2(a), the complete state change of the output terminals from the low level to the high level (curve B') delays with a time period $\Delta t1$, compared with curve B. On the other hand, since the number of the output terminals on changing from the high level to the low level is less than that in FIG. 2(a), the state change of the output terminals indicated by curve A' occurs in advance compared to curve A with a time period $\Delta t3$. The opposite shifts of the state change timing enlarge the SSO skew. The delay time $\Delta t1$ and the advancing time $\Delta t3$ will increase and thus the SSO skew will be even serious when the number of the output terminals changing from the low level to the high level is even larger than the other.

Figure 2C:
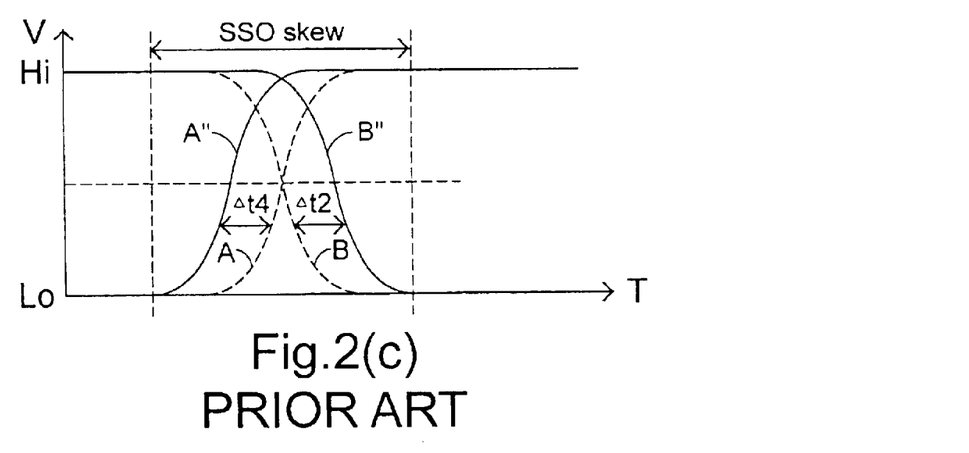

Likewise, referring to FIG. 2(c), a case that the number of output terminals changing from the high level to the low level is larger than the number of output terminals changing from the low level to the high level is illustrated. Since the number of the output terminals on changing from the high level to the low level is increased compared to the case shown in FIG. 2(a), the complete state change of the output terminals from the high level to the low level (curve B") delays with a time period $\Delta t2$, compared with curve B. On the other hand, since the number of the output terminals on changing from the low level to the high level is less than that in FIG. 2(a), the state change of the output terminals indicated by curve A" occurs in advance compared to curve A with a time period $\Delta t4$. The opposite shifts of the state change timing also enlarge the SSO skew. The delay time $\Delta t2$ and the advancing time $\Delta t4$ will increase and thus the SSO skew will be even serious when the number of the output terminals changing from the low level to the high level is even larger than the other.

When the buses connected to the output terminals of the output buffers operate at a low speed, the SSO skew phenomenon can be neglected. However, with the increasing operating speeds of the buses, even the tiny timing difference resulting from SSO skew may cause erroneous data access or breakdown of the overall computer system.

SUMMARY OF THE INVENTION

It is an object of the present invention to provide an output circuit and a method for reducing simultaneous switching output (SSO) skew by adjusting the time shifts occurring when the numbers of the output terminals on changing to contrary states differentiate, so as to enhance overall performance of the computer system.

In accordance with a first aspect of the present invention, there is provided an output circuit for outputting data with reduced simultaneous switching output skew. The output circuit comprises N counts of output buffers and a comparator. The N counts of output buffers is used for outputting an N-bit data in response to N counts of bit signals, respectively, and comprises at least two delay units for processing two of the bit signals into a first and a second delayed bit signals with a first and a second delay periods, respectively, in response to a delay signal. The first and the second delay periods are different in a first situation and identical in a second situation. The comparator is in communication with the N counts of output buffers, compares the N counts of bit signals sampled at a first time spot and a second time spot, and generates the delay signal according to the comparing result.

In an embodiment, the first situation stands when the number of the output buffers changing from the high level to the low level at output terminals thereof between the first and the second time spots is larger than that changing from the low level to the high level to a predetermined extent.

In an embodiment, the first situation stands when the number of the output buffers changing from the high level to the low level at output terminals thereof between the first and the second time spots is less than that changing from the low level to the high level to a predetermined extent.

In an embodiment, the second situation stands when the difference of the number of the output buffers changing from the high level to the low level at output terminals thereof between the first and the second time spots and that changing from the low level to the high level is within a specified range.

In an embodiment, the second situation stands when all the N counts of output buffers change from the high level to the low level at output terminals thereof between the first and the second time spots.

In an embodiment, the second situation stands when all the N counts of output buffers change from the low level to the high level at output terminals thereof between the first and the second time spots.

In an embodiment, the output buffers further comprise a pull-up unit and a pull-down unit. The pull-up unit is electrically connected to one of the delay units and a source voltage, and enabled to output corresponding one of the first and the second delayed bit signals as the high level. The pull-down unit is electrically connected to the other one of the delay units and a ground voltage, and enabled to output the other one of the first and the second delayed bit signals as the low level.

In accordance with a second aspect of the present invention, there is provided an output circuit for outputting data with reduced simultaneous switching output skew. The output circuit comprises N counts of output buffers and a comparator. The N counts of output buffers are used for outputting an N-bit data in response to N counts of bit signals, respectively. At least one of the output buffers comprises a delay unit, a pull-up unit and a pull-down unit. The delay unit is used for processing one of the bit signals into a delayed bit signal with an adjustable delay period in response to a delay signal. The pull-up unit is electrically connected to the delay unit and a source voltage, and selectively enabled to output the delayed bit signal as a high level, and a pull-down unit electrically connected to the delay unit and a ground voltage, and selectively enabled to output the delayed bit signal as a low level. The comparator is in communication with the N counts of output buffers, compares the N counts of bit signals sampled at a first time spot and a second time spot, and generates the delay signal according to the comparing result.

In an embodiment, the delay signal is at a first logic state when a first number of the output buffers changing from the high level to the low level at output terminals thereof between the first and the second time spots is larger or less than a second number of the output buffers changing from the low level to the high level to a predetermined extent, and the delay signal is at a second logic state level when the difference between the first and the second numbers is within a specified range.

In an embodiment, the comparator further generates a control signal which is at the first logic state when the first number is smaller than the second number, and at the second logic state when the first number is larger than the second number.

In an embodiment, the first logic state is logic high and the second logic state is logic low.

In an embodiment, the delay unit comprises an adder/subtractor and a delay adjusting circuit. The adder/subtractor is electrically connected to the comparator, performs an adding operation of the delay signal with a preset value when corresponding one of the bit signals is at the high level and the control signal is at the low logic state, or when the corresponding one of the bit signals is at the low level and the control signal is at the high logic state, and performs a subtracting operation of the delay signal with the preset value when the corresponding one of the bit signals and the control signal are both logic high or both logic low. The delay adjusting circuit is electrically connected to the adder/subtractor, and processes the corresponding one of the bit signals into the delayed bit signal with a certain delay period according to the result of the adding operation or the subtracting operation.

In an embodiment, the certain delay period is a basic delay period if the result of the adding or subtracting operation is equal to the preset value, the certain delay period is longer than the basic delay period when the result of the adding or subtracting operation is greater than the preset value, and the certain delay period is shorter than the basic delay period when the result of the adding or subtracting operation is smaller than the preset value.

In an embodiment, the delay adjusting circuit comprises a plurality of buffers and a multiplexer. The plurality of buffers are electrically interconnected in series, and differentially impart the corresponding one of the bit signals with a plurality of delay periods, respectively. The multiplexer is electrically connected to the adder/subtractor and the plurality of buffers, and selects one of the plurality of delay periods as the certain delay period in response to a select signal correlating to the result of the adding operation or the subtracting operation.

In accordance with a third aspect of the present invention, there is provided a method for outputting data with reduced simultaneous switching output skew. Firstly, bit signals sampled at a current time spot are compared with those sampled at a preceding time spot to obtain a first number of the bit signals changing from the high level to the low level and a second number of the bit signals changing from the low level to the high level. Then, the first number is compared with the second number to obtain a first comparing result, and a delay control signal is asserted according to the first comparing result of the first number and the second number. Then, each of the bit signals is processed into a delayed bit signal with a certain delay period, wherein the certain delay period is determined by the delay control signal. Afterward, each the delayed bit signal is outputted.

In an embodiment, before outputting each the delayed bit signal, the method further comprising steps of pulling up the delayed bit signal when the delay bit signal is at the high level, and pulling down the delayed bit signal when the delay bit signal is at the low level.

In an embodiment, the delay control signal includes a delay signal for delaying any of the bit signals changing from the high level to the low level with a first delay period, and delaying any of the bit signals changing from the low level to the high level with a second delay period. The second delay period is different from the first delay period when the difference between the first and the second numbers is beyond a preset range.

In an embodiment, the first delay period is longer than the second delay period when the first number is smaller than the second number, and the first delay period is shorter than the second delay period when the first number is larger than the second number.

In an embodiment, the second delay period is equal to the first delay period when the difference between the first and the second numbers is within a preset range.

In an embodiment, the delay control signal includes a control signal being a first logic state when the first number is larger than the second number, and a second logic state when the first number is smaller than the second number.

In an embodiment, the step of processing each of the bit signals comprises sub-steps of determining which one of an adding operation and a subtracting operation is performed for one of the bit signals with high/low level change and the control signal, performing the adding operation or the subtracting operation of the delay signal with a preset value to obtain an operational result, comparing the operation al result with the preset value to obtain a second comparing result, selecting one of a plurality of preset delay periods as the first delay period or the second delay period according to the second comparing result, and delaying the one of the bit signals with the first or the second delay period.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 3A:
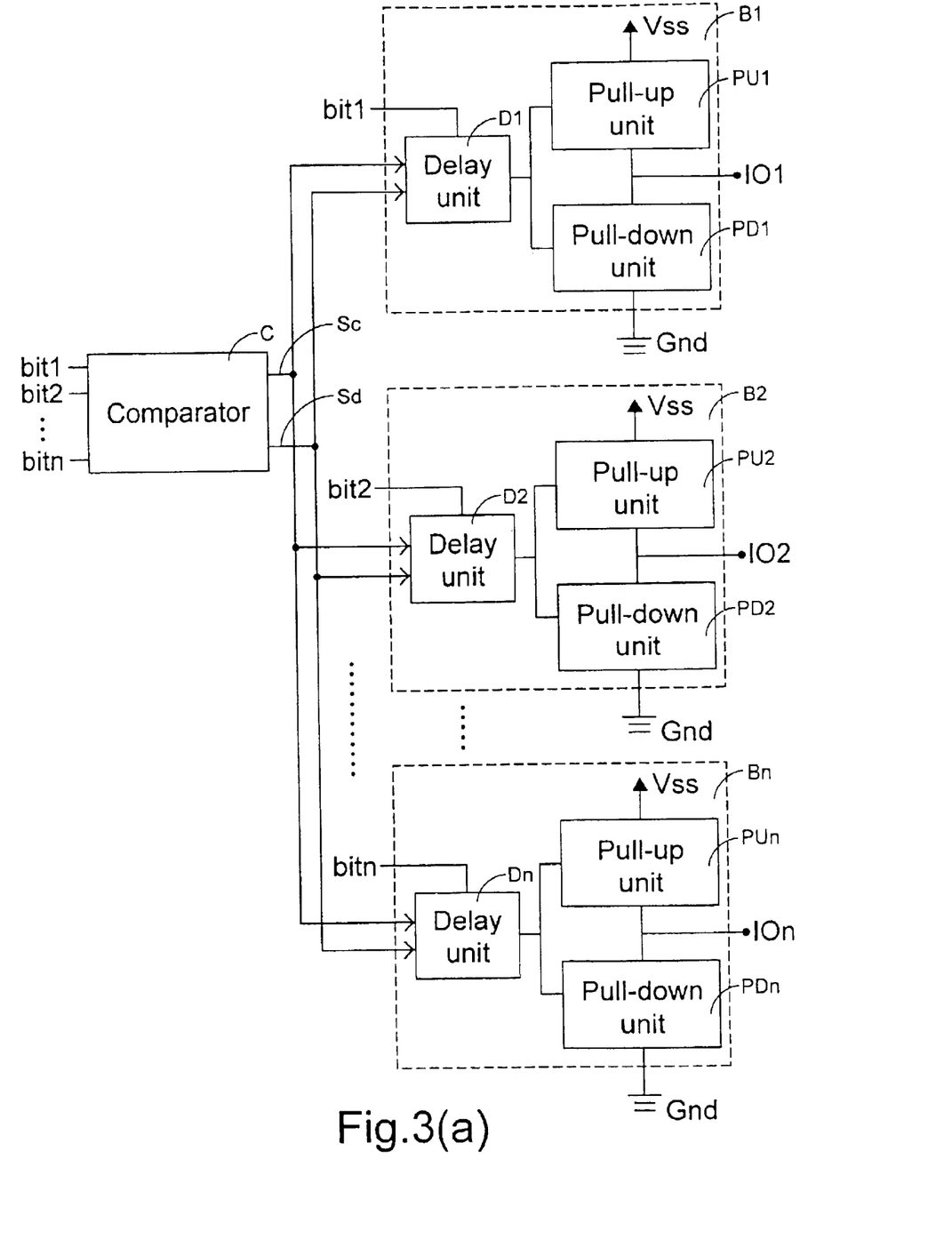
FIG. 3(a) is a circuit block diagram illustrating an N-bit output circuit for outputting data with reduced simultaneous switching output skew according to a preferred embodiment of the present invention.

Please refer to FIG. 3(a), an N-bit output circuit according to a preferred embodiment of the present invention is shown. The output circuit comprises N counts of output buffers B1~Bn. Each of the output buffers B1~Bn comprises a delay unit (D1~Dn), a pull-up unit (PU1~PUn) and a pull-down unit (PD1~PDn). The pull-up unit (PU1~PUn) and the pull-down unit (PD1~PDn) are coupled to a common power source Vss and a common ground Gnd, respectively. The input signals bit1~bitn are inputted into the delay units (D1~Dn) of the output buffers B1~Bn to be independently delayed, respectively, and selectively processed by the pull-up units PU1~PUn or the pull-down units PD1~PDn into output bit signals, which are outputted from respective output terminals IO1~Ion as desired output data. The output terminals IO1~IOn are common nodes of the pull-up units PU1~PUn and the pull-down units PD1~PDn, as shown.

The output circuit of the present invention further comprises a comparator C electrically connected to and arranged upstream of the output buffers, which receives and compares the bit signals bit1~bitn sampled at a current time spot and a preceding time spot. According to the comparing result, a control signal Sc and a delay signal Sd are generated. For example, the control signal Sc is at a logic state "1" when a first number of the output buffers changing from the high level to the low level at output terminals thereof between the current and the preceding time spots is smaller than a second number of the output buffers changing from the low level to the high level at output terminals thereof between the current and the preceding time spots. Whereas, the control signal Sc is at a logic state "0" when the first number is larger than the second number. On the other hand, the logic state of the delay signal Sd is "1" when the first number is larger or less than the second number to a predetermined extent, e.g. the difference between the first number and the second number is larger than a threshold value. Whereas, the logic state of the delay signal Sd is "0" when the difference between the first and the second numbers is within a specified range, e.g. the difference is smaller than the threshold value. Take an 8-bit signal for example. When the difference between the first and the second numbers is larger than 2, the logic state of the delay signal Sd is determined to be "1". Otherwise, the logic state of the delay signal Sd is "0". The control signal Sc and delay signal Sd are then transmitted to the downstream output buffers B1~Bn to determine how the individual bit signals bit1~bitn are delayed.

Figure 3B:
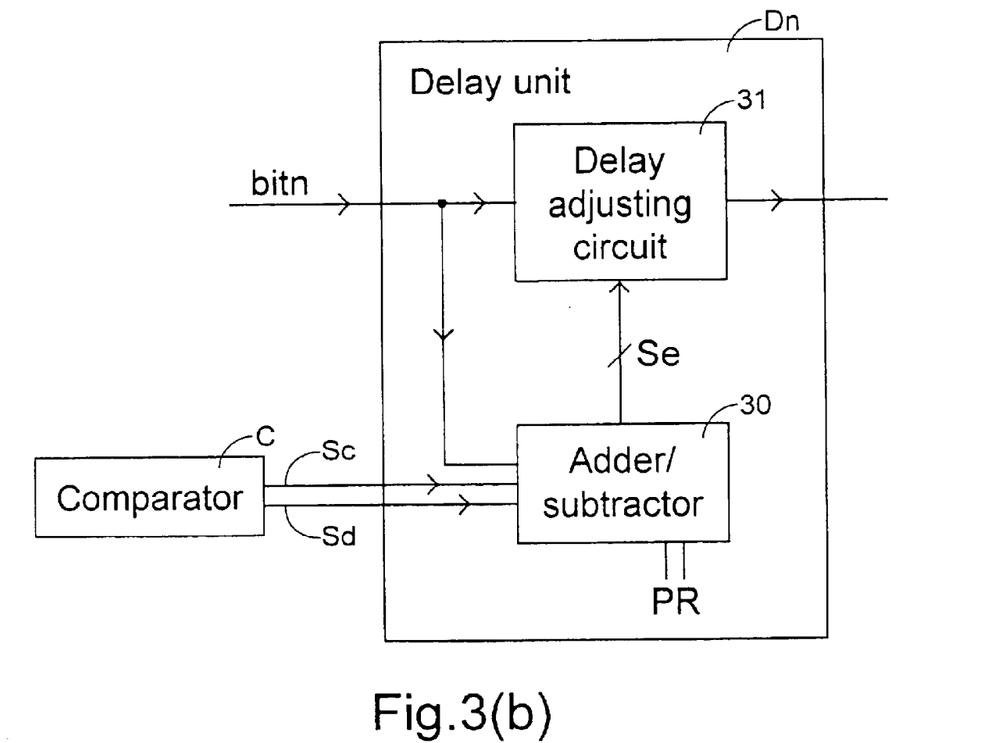
FIG. 3(b) is a schematic circuit block diagram illustrating a delay unit included in the output circuit of FIG. 3(a)

The circuit configuration of each of the delay units D1~Dn in a preferred embodiment is shown in FIG. 3(b). The delay unit, e.g. Dn, comprises an adder/subtractor 30 and a delay adjusting circuit 31. The adder/subtractor 30 is electrically connected to the comparator C for performing either an adding operation or a subtracting operation of the delay signal Sd with a preset value PR. Which of the adding operation and the subtracting operation is performed is according to a correlation table shown below.

TABLE 1

| Control signal (Sc) | Bit signal (bit1~bitn) | Operation |
|---|---|---|
| 1 | 1 | subtracting operation |
| 0 | 1 | adding operation |
| 1 | 0 | adding operation |
| 0 | 0 | subtracting operation |

When the bit signal bitn received by the delay unit Dn has a high level, i.e. logic 1, and the control signal Sc is at the low logic state "0", or when the bit signal bitn is has a low level, i.e. logic "0", and the control signal Sc is at the high logic state "1", an adding operation of the delay signal Sd with the present value PR is performed. On the contrary, when the bit signal bitn and the control signal Sc are both logic high, i.e. logic "1", or when the bit signal bitn and the control signal Sc are both logic low, i.e. logic "0", a subtracting operation of the delay signal Sd with the preset value PR is performed. According to the operational result, a select signal Se is generated by the adder/subtractor 30 for the reference of the delay adjusting circuit 31 to determine a suitable delay period.

Figure 4:
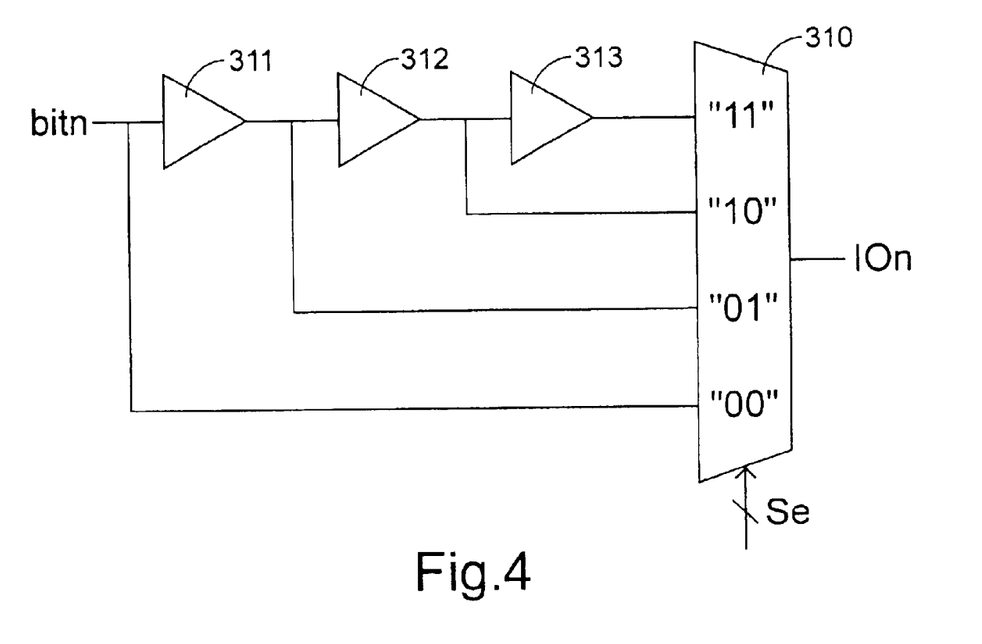
FIG. 4 is a circuit configuration of a delay adjusting circuit used in the delay unit of FIG. 3(b)

Referring to FIG. 4, an exemplified circuit configuration of the delay adjusting circuit 31 of FIG. 3(b) is shown. The delay adjusting circuit 31 comprises three buffers 311, 312 and 313 electrically interconnected in series, and a multiplexer 310. The buffers 311, 312 and 313 impart the bit signal bitn with different delay periods, respectively. In response to the select signal Se correlating to the operational result of the adder/subtractor 30, the multiplexer 310 selects one of the different delay periods as a delay period to delay the bit signal bitn, and the delayed bit signal is outputted via the output terminal IOn. Assume the bit value of the preset value PR is "10". If the operational result of the adder/subtractor 30 indicates that the sum or the difference between the delay signal Sd and the preset value PR is equal to the preset value PR, the select signal Se is set to be "10". Accordingly, the selected delay period is a basic delay period. If the operational result of the adder/subtractor 30 indicates that the sum or the difference between the delay signal Sd and the preset value PR is larger than the preset value PR, it is set Se="11", and the selected delay period is longer than the basic delay period. Otherwise, it is set Se="01", the delay period is shorter than the basic delay period. Of course, an additional or alternative 2-bit value "00" can also be used for no delay of the bit signal when the sum or the difference between the delay signal Sd and the preset value PR is smaller than the preset value PR, depending on the circuit design. The number of the buffers used in the delay adjusting circuit 31 can be increased so as to finely adjust the delay period according to practical requirements.

The operation principles of the above N-bit output circuit will be described in more details with reference to the following examples.

Figure 5A:
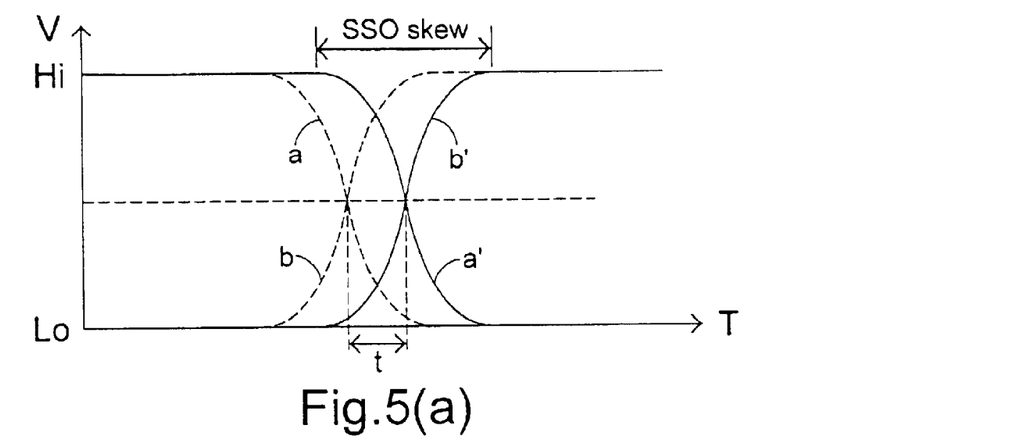
FIGS. 5(a), 5(b) and 5(c) are timing waveform diagrams exemplifying adjustment of individual bit signals according to the data-output method of the present invention in order to reducing SSO skew of the output data.
Figure 5B:
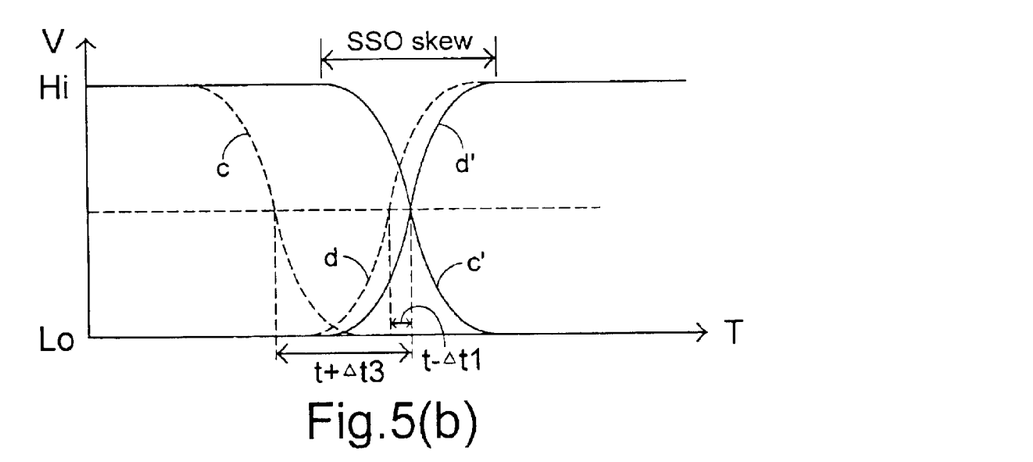

In a first example, an 8-bit data is to be outputted by the present output means in response to 8 bit signals, and the case that the 8 bit signals changing from "00000001" to "11111110" is discussed. In this example, the number of the output buffers changing from the high level to the low level at output terminals thereof is 1, and the number of the output buffers changing from the low level to the high level at output terminals thereof is 7. In other words, more output terminals are changing from low to high than from high to low, so the control signal Sc generated from the comparator C is at a logic state "1". Since the difference between the numbers is 6, which is larger than 2, the logic state of the delay signal Sd is "1". Meanwhile, each of the first to the seventh bit signals is changed from the low level logic "0" to the high level logic "1". Therefore, according to the correlation table mentioned above, a subtracting operation of the delay signal Sd ("1") with the preset value PR "10" is performed by the adder/subtractor 30, thereby generating the select signal Se as "01". In response to the select signal Se "01", the delay adjusting circuit of each of the delay units corresponding to the first to the seventh bit signals outputs a delayed bit signal with a delay period (t−Δt1). On the other hand, the eighth bit signal changing from "1" to "0", along with the logic "1" state of the control signal Sc, determines that an adding operation of the delay signal Sd ("1") with the preset value PR "10" is performed by the adder/subtractor 30, thereby generating the select signal Se as "11". In response to the select signal Se "11", the delay adjusting circuit associated with the eighth bit signal outputs a delayed bit signal with a delay period (t+Δt3), which is longer than the deplay period (t−Δt1). The delaying results are illustrated in FIG. 5(b). It is understood from this example that for the first to the seventh output buffers, the delay time is made shorter than that for the eighth output buffer. By this way, the curves in FIG. 5(b) can be modified from the dash lines c and d to the solid lines c' and d', which are made closer to each other than the undelayed ones, so as to reduce SSO skew.

In a second example that 8 bit signals change from "00-1" to "11-0", where the symbol "-" represents the bit signal with no level change. In this example, the number of the output buffers changing from the high level to the low level at output terminals thereof is 1, and the number of the output buffers changing from the low level to the high level at output terminals thereof is 2. In other words, more output terminals are changing from low to high than from high to low, so the control signal Sc generated from the comparator C is at a logic state "1". Since the difference between the numbers is 1, which is not larger than 2, the logic state of the delay signal Sd is "0". Meanwhile, each of the first to the second bit signals is changed from the low level logic "0" to the high level logic "1". Therefore, according to the correlation table mentioned above, a subtracting operation of the delay signal Sd ("0") with the preset value PR "10" is performed by the adder/subtractor 30, thereby generating the select signal Se as "10". In response to the select signal Se "10", the delay adjusting circuit of each of the delay units corresponding to the first to the second bit signals outputs a delayed bit signal with a basic delay time (t). On the other hand, the eighth bit signal changing from "1" to "0", along with the logic "1" state of the control signal Sc, determines that an adding operation of the delay signal Sd ("0") with the preset value PR "10" is performed by the adder/subtractor 30, thereby generating the select signal Se as "10". In response to the select signal Se "10", the delay adjusting circuit associated with the eighth bit signal outputs a delayed bit signal with the basic delay period, too. The delaying results are illustrated in FIG. 5(a). It is understood that since the changing number from high to low is very close to the changing number from low to high in this example, little skew effect is rendered. Thus, the curves a and b need not to be pulled close to each other further. Therefore, the same delay time t is imparted to each of the first, second and eighth bit numbers. Similar results can be seen in examples that bit signals change from "11-0" to "00-1", bit signals change from "00001111" to "11110000", or any other just slightly changed bit signals.

Figure 5C:
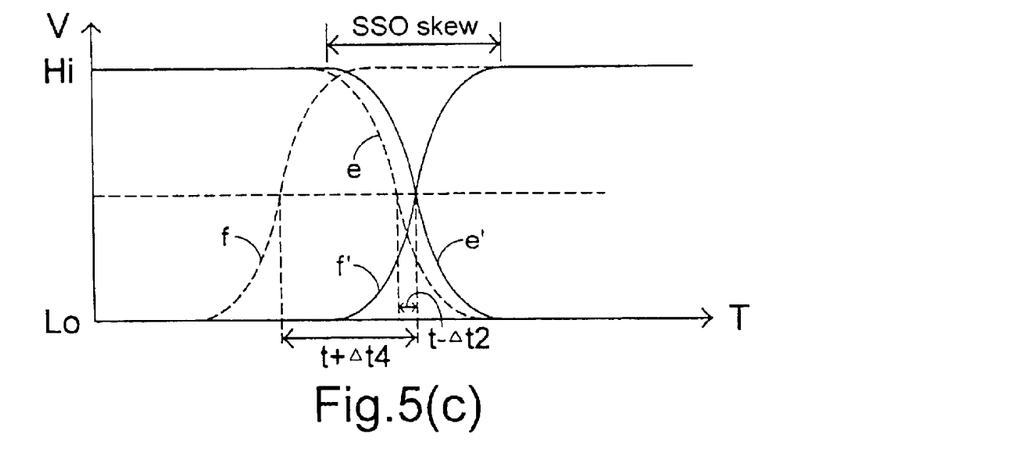

A third example is given by changing the bit signals from "11111110" to "00000001". In this example, the number of the output buffers changing from the high level to the low level at output terminals thereof is 7, and the number of the output buffers changing from the low level to the high level at output terminals thereof is 1. In other words, less output terminals are changing from low to high than from high to low, so the control signal Sc generated from the comparator C is at a logic state "0". Since the difference between the numbers is 6, which is larger than 2, the logic state of the delay signal Sd is "1". Meanwhile, each of the first to the seventh bit signals is changed from the high level logic "1" to the low level logic "0". Therefore, according to the correlation table mentioned above, a subtracting operation of the delay signal Sd ("1") with the preset value PR "10" is performed by the adder/subtractor 30, thereby generating the select signal Se as "01". In response to the select signal Se "01", the delay adjusting circuit of each of the delay units corresponding to the first to the seventh bit signals outputs a delayed bit signal with a delay period (t−Δt2). On the other hand, the eighth bit signal changing from "0" to "1", along with the logic "0" state of the control signal Sc, determines that an adding operation of the delay signal Sd ("1") with the preset value PR "10" is performed by the adder/subtractor 30, thereby generating the select signal Se as "11". In response to the select signal Se "11", the delay adjusting circuit associated with the eighth bit signal outputs a delayed bit signal with a delay period (t+Δt4), which is longer than the deplay period (t−Δt2). The delaying results are illustrated in FIG. 5(c). It is understood from this example that for the first to the seventh output buffers, the delay time is made longer than that for the eighth output buffer. By this way, the curves in FIG. 5(c) can be modified from the dash lines e and f to the solid lines e' and f', which are made closer to each other than the undelayed ones, so as to reduce SSO skew.

In a fourth example, the bit signals change from "11111111" to "00000000". In this example, the number of the output buffers changing from the high level to the low level at output terminals thereof is 8, and the number of the output buffers changing from the low level to the high level at output terminals thereof is 0. In other words, less output terminals are changing from low to high than from high to low, so the control signal Sc generated from the comparator C is at a logic state "0". Since the difference between the numbers is 8, which is larger than 2, the logic state of the delay signal Sd is "1". Meanwhile, each of the first to the eighth bit signals is changed from the high level logic "1" to the low level logic "0". Therefore, according to the correlation table mentioned above, a subtracting operation of the delay signal Sd ("1") with the preset value PR "10" is performed by the adder/subtractor 30, thereby generating the select signal Se as "11". In response to the select signal Se "11", all the first to the eighth bit signals are outputted with the same delay time longer than the basic delay peiod t.

In a fifth example, the bit signals change from "00000000" to "11111111". In this example, the number of the output buffers changing from the high level to the low level at output terminals thereof is 0, and the number of the output buffers changing from the low level to the high level at output terminals thereof is 8. In other words, more output terminals are changing from low to high than from high to low, so the control signal Sc generated from the comparator C is at a logic state "1". Since the difference between the numbers is 8, which is larger than 2, the logic state of the delay signal Sd is "1". Meanwhile, each of the first to the eighth bit signals is changed from the low level logic "0" to the high level logic "1". Therefore, according to the correlation table mentioned above, a subtracting operation of the delay signal Sd ("1") with the preset value PR "10" is performed by the adder/subtractor 30, thereby generating the select signal Se as "01". In response to the select signal Se "01", all of the first to the eighth bit signals are outputted with the same delay time shorter than the basic delay period t.

In the output circuits illustrated above, it is understood that the N-bit data can be outputted with reduced simultaneous switching output skew by differentially imparting the bit signals with suitable delay periods. Therefore, erroneous data access or breakdown of the overall computer system due to the SSO skew can be effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An output circuit for outputting data with reduced simultaneous switching output skew, said output circuit comprising:

N counts of output buffers receiving N counts of bit signals, respectively, at least one of said output buffers comprising a delay unit for processing one of said bit signals into a delayed bit signal with an adjustable delay period in response to a delay signal, a pull-up unit electrically connected to said delay unit and a source voltage, and selectively enabled to output said delayed bit signal as a high level, and a pull-down unit electrically connected to said delay unit and a ground voltage, and selectively enabled to output said delayed bit signal as a low level; and a comparator in communication with said N counts of output buffers, comparing said N counts of bit signals sampled at a first time spot and a second time spot, and generating said delay signal according to the comparing result.

2. The output circuit according to claim 1 wherein said delay signal is at a first logic state when a first number of said output buffers changing from said high level to said low level at output terminals thereof between said first and said second time spots is larger or less than a second number of said output buffers changing from said low level to said high level to a predetermined extent, and said delay signal is at a second logic state level when the difference between said first and said second numbers is within a specified range.

3. The output circuit according to claim 2 wherein said comparator further generates a control signal which is at said first logic state when said first number is smaller than said second number, and at said second logic state when said first number is larger than said second number.

4. The output circuit according to claim 3 wherein said first logic state is logic high and said second logic state is logic low.

5. The output circuit according to claim 3 wherein said delay unit comprises:

an adder/subtractor electrically connected to said comparator, performing an adding operation of said delay signal with a preset value when corresponding one of said bit signals is at said high level and said control signal is at said low logic state, or when said corresponding one of said bit signals is at said low level and said control signal is at said high logic state, and performing a subtracting operation of said delay signal with said preset value when said corresponding one of said bit signals and said control signal are both logic high or both logic low; and a delay adjusting circuit electrically connected to said adder/subtractor, processing said corresponding one of said bit signals into said delayed bit signal with a certain delay period according to the result of said adding operation or said subtracting operation.

6. The output circuit according to claim 5 wherein said certain delay period is a basic delay period if the result of said adding or subtracting operation is equal to said preset value, said certain delay period is longer than said basic delay period when the result of said adding or subtracting operation is greater than said preset value, and said certain delay period is shorter than said basic delay period when the result of said adding or subtracting operation is smaller than said preset value.

7. The output circuit according to claim 5 wherein said delay adjusting circuit comprises:

a plurality of buffers electrically interconnected in series, differentially imparting said corresponding one of said bit signals with a plurality of delay periods, respectively; and a multiplexer electrically connected to said adder/subtractor and said plurality of buffers, selecting one of said plurality of delay periods as said certain delay period in response to a select signal correlating to the result of said adding operation or said subtracting operation.

8. An output circuit for outputting data with reduced simultaneous switching output skew, said output circuit comprising:

N counts of output buffers receiving N counts of bit signals, respectively, comprising at least two delay units for processing two of said bit signals into a first and a second delayed bit signals with a first and a second delay periods, respectively, in response to a delay signal, wherein said first and said second delay periods are different in a first situation and identical in a second situation; and a comparator in communication with said N counts of output buffers, comparing said N counts of bit signals sampled at a first time spot and a second time spot, and generating said delay signal according to the comparing result.

9. The output circuit according to claim 8 wherein said first situation stands when the number of said output buffers changing from the high level to the low level at output terminals thereof between said first and said second time spots is larger than that changing from the low level to the high level to a predetermined extent.

10. The output circuit according to claim 8 wherein said first situation stands when the number of said output buffers changing from the high level to the low level at output terminals thereof between said first and said second time spots is less than that changing from the low level to the high level to a predetermined extent.

11. The output circuit according to claim 8 wherein said second situation stands when the difference of the number of said output buffers changing from the high level to the low level at output terminals thereof between said first and said second time spots and that changing from the low level to the high level is within a specified range.

12. The output circuit according to claim 8 wherein said second situation stands when all said N counts of output buffers change from the high level to the low level at output terminals thereof between said first and said second time spots.

13. The output circuit according to claim 8 wherein said second situation stands when all said N counts of output buffers change from the low level to the high level at output terminals thereof between said first and said second time spots.

14. The output circuit according to claim 8 wherein said output buffers further comprise:

a pull-up unit electrically connected to one of said delay units and a source voltage, and enabled to output corresponding one of said first and said second delayed bit signals as the high level; and a pull-down unit electrically connected to the other one of said delay units and a ground voltage, and enabled to output the other one of said first and said second delayed bit signals as the low level.

15. A method for outputting data with reduced simultaneous switching output skew, comprising steps of:

comparing bit signals sampled at a current time spot with those sampled at a preceding time spot to obtain a first number of said bit signals changing from the high level to the low level and a second number of said bit signals changing from the low level to the high level;

comparing said first number with said second number to obtain a first comparing result, and asserting a delay control signal according to said first comparing result;

processing each of said bit signals into a delayed bit signal with a certain delay period, wherein said certain delay period is determined by said delay control signal; and outputting each said delayed bit signal.

16. The method according to claim 15 further comprising steps, before outputting each said delayed bit signal, of pulling up said delayed bit signal when said delay bit signal is at the high level, and pulling down said delayed bit signal when said delay bit signal is at the low level.

17. The method according to claim 15 wherein said delay control signal includes a delay signal for delaying any of said bit signals changing from the high level to the low level with a first delay period, and delaying any of said bit signals changing from the low level to the high level with a second delay period, and wherein said second delay period is different from said first delay period when the difference between said first number and said second number is beyond a preset range.

18. The method according to claim 17 wherein said first delay period is longer than said second delay period when said first number is smaller than said second number, and said first delay period is shorter than said second delay period when said first number is larger than said second number.

19. The method according to claim 17 wherein said second delay period is equal to said first delay period when the difference between said first number and said second number is within a preset range.

20. The method according to claim 17 wherein said delay control signal includes a control signal being a first logic state when said first number is larger than said second number, and a second logic state when said first number is smaller than said second number.

21. The method according to claim 20 wherein said step of processing each of said bit signals comprises sub-steps of:

determining which one of an adding operation and a subtracting operation is performed for one of said bit signals with high/low level change and said control signal;

performing said adding operation or said subtracting operation of said delay signal with a preset value to obtain an operational result;

comparing said operational result with said preset value to obtain a second comparing result;

selecting one of a plurality of preset delay periods as said first delay period or said second delay period according to said second comparing result; and delaying said one of said bit signals with said first or said second delay period.

* * * * *